United States Patent

[11] 3,596,150

[72] Inventors Gottfried Berthold Ludwigsburg-Osswell; Hans Linstedt, Stuttgart; Günter Matthäi, Schwieberdingen, all of, Germany
[21] Appl. No. 828,613
[22] Filed May 28, 1969
[45] Patented July 27, 1971
[73] Assignee Robert Bosch GmbH Stuttgart, Germany
[32] Priority June 8, 1968
[33] Germany
[31] P 17 64 455.2

[54] MONOLITHIC TRANSISTOR CIRCUIT
10 Claims, 5 Drawing Figs.

[52] U.S. Cl. .......... 317/235 R, 317/235 D, 317/235 Z
[51] Int. Cl. .......... H01l 19/00
[50] Field of Search .......... 317/235 D, 235 l; 307/213, 303, 315

[56] References Cited
UNITED STATES PATENTS
3,210,617 10/1965 Kruper .......... 307/315

FOREIGN PATENTS
6,606,083 11/1967 Netherlands .......... 30/235

OTHER REFERENCES
Electronics, " New Monolithic Darlington Silicon Power Circuit Offers High Gain, High Speed, Small Size" Apr. 5, 1965 page 116 317/235/22

*Primary Examiner*—Jerry D. Craig
*Attorney*—Michael S. Striker

ABSTRACT: A semiconductor body of collector material has a first and second base region diffused into the collector material, and a first and second emitter region diffused into the base regions. A narrow channel of base material connects the two base regions. A metallic coating connects the first emitter region with the second base region. This metallic coating extends over the connecting channel and is situated directly on the surface of the semiconductor body. The first emitter region may be extended into the second base region directly under the metal coating which connects the first emitter with the second base.

INVENTORS
Gottfried BERTHOLD
Hans LINSTEDT
Günter MATTHÄI
BY
[signature]
their ATTORNEY INVENTORS
Gottfried BERTHOLD
Hans LINSTEDT
Günter MATTÄI
BY
[signature]
their ATTORNEY

MONOLITHIC TRANSISTOR CIRCUIT

BACKGROUND OF THE INVENTION

This invention relates to a monolithic two-transistor circuit manufactured in planar technique. In particular it relates to a Darlington transistor circuit wherein a first transistor acts as a driving transistor and a second transistor acts as a a power transistor. The two collectors are directly connected electrically, the base of the power transistor is connected to the emitter of the driving transistor, and an equivalent resistance exists in parallel to the emitter-base junction of the driving transistor. External connections are made to the transistor at the common collector to form a collector connection, at the base of the driving transistor to constitute the external base connection and at the emitter of the power transistor to constitute the external emitter connection. The circuit as a whole, thus functions as a single transistor relative to these external connections.

The journal "Electronics" of Apr. 5, 1965, on page 116, shows a Darlington transistor circuit on which the metallic connection between the emitter of the first or driving transistor and the base of the second or power transistor is formed by a metallic coating on top of the oxide. This type of Darlington transistor circuit has the disadvantage, that the breakdown voltage of the oxide on top to the collector is relatively low and that therefore, in the case of high-voltage transistors, an additional processing step for strengthening the oxide is required. When the metal coating is applied over the oxide the subsequent leading of the metal coating, which is desirable for purposes of mounting the crystal in a single passage through the oven, is also made more difficult. Furthermore, when the metal coating is applied over the oxide, an additional "photoresist" step is required.

Another embodiment of a Darlington transistor circuit of the type described above is shown in U.S. Pat. No. 3,316,466. This shows a monolithic Darlington transistor circuit having a single base for both transistors and having a special construction for the above-named connection of the emitter of the driving transistor to the base of the power transistor. This single-base construction results, for both transistors, in the creation of a resistance parallel to the emitter-base junction. While this resistance may be made relatively high by use of a base material of high resistivity, this type of construction restricts the choice of the alloying geometry and the choice of base material to a substantial extent.

SUMMARY OF THE INVENTION

It is the object of this invention to eliminate the drawbacks set forth above.

It is a particular object of this invention to develop a Darlington transistor circuit of this type which does not have conductive connections on top of the oxide. At the same time, such a circuit is to permit the resistance value parallel to the emitter-base junction of the first or driving transistor to have a value which may be determined at will. This value is, preferably a high-resistance value.

Thus, in accordance with this invention, a two-transistor circuit manufactured in planar technique comprises a first transistor having a first base, first emitter and first collector, and a second transistor having a second base, a second emitter, and second collector. The external connections to this monolithic two-transistor circuit include a collector connection, which is connected to both collectors, an external emitter connection connected to the second emitter and an external base connection directly connected to the first base. Each base consists of a base region diffused into the semiconductor body which is of collector material. A connecting channel of base material connects the first base region to the second base region. First and second emitter regions are diffused into the base regions to constitute, respectively, said first and second emitter. Electrically conductive connecting means between said first emitter and said second base are applied directly to the surface of the semiconductor body.

These electrically conductive connecting means are a metallic coating, which extends over the connecting channel.

In order to increase the resistance in parallel to the emitter-base junction of the first or driving transistor, the emitter of the driving transistor may be extended under the metal coating which connects this emitter to the second base, into the second base region which constitutes the base of the power transistor.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

The preferred embodiments of the present invention will now be discussed in relation to the figures.

Figure 1:
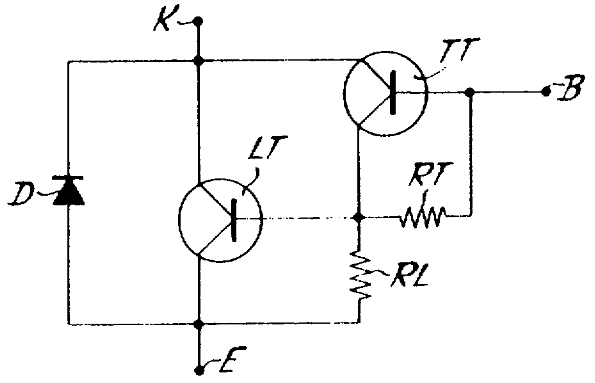
FIG. 1 shows an electric circuit diagram of a Darlington transistor circuit.

FIG. 1 is a schematic diagram of a Darlington transistor circuit. The base of the second or power transistor LT is connected with the emitter of the first, or driving transistor TT. The collectors of both transistors are connected in common. Thus a transistor unit is formed which has as external connections a collector connection K, an emitter connection E and a base connection B and may be considered as a single transistor. A resistance $R_T$ is in parallel to the emitter-base junction of the first transistor TT, a resistance $R_L$ is in parallel to the emitter-base junction of power transistor LT, while a protective diode D is in parallel to the emitter-collector junction of power transistor LT.

Figure 2:
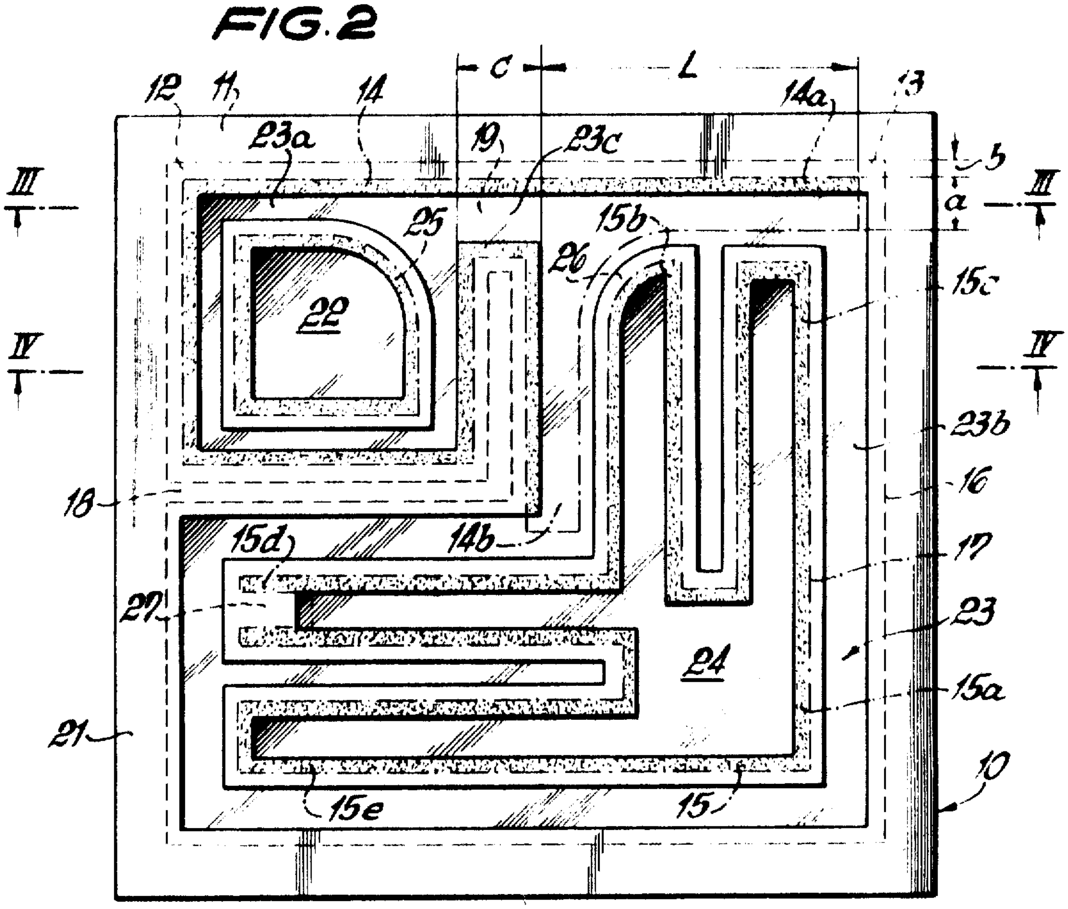
FIG. 2 is a first, simplified embodiment of the monolithic Darlington transistor circuit according to this invention showing the principal features thereof in a horizontal projection.
Figure 3:
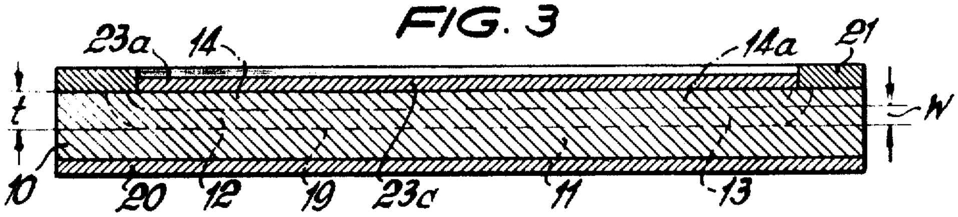
FIG. 3 is a section along line III–III of FIG. 2.
Figure 4:
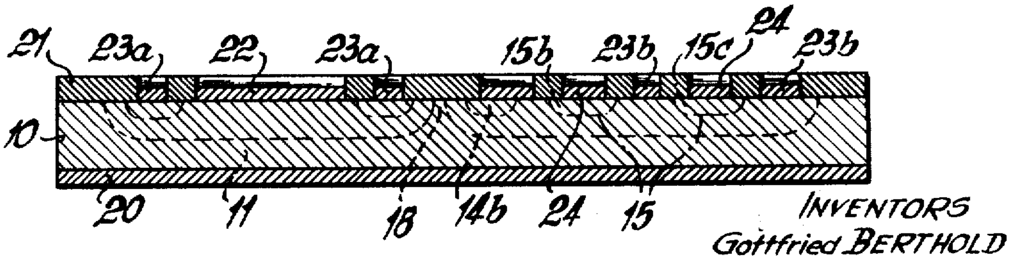
FIG. 4 is a section along line IV–IV of FIG. 2.

FIGS. 2 through 4 show a simplified embodiment of a Darlington transistor circuit in accordance with the present invention. The circuit shown in FIG. 1 is embodied in a monolithic structure manufactured in planar technique. Base regions 12 and 13 are diffused into a uniform semiconductor body of collector material, for example a silicon disc 10. Emitter regions 14 and 15 respectively constituting said first and second emitters, are diffused from the top into the base regions.

The base-collector junction is shown in dashed lines, w! ile the emitter-base junction is shown in dash-dot lines. Thus dashed line 16 shows the edge of the base diffusion region, that is, those locations at which the base-collector junction intersects the top surface of the semiconductor body. The dash-dot lines 17, also in FIG. 2, shows the edge of the emitter diffusion region, that is, those location at which the emitter-base junction intersects the top surface of the semiconductor body. Furthermore, for increased clarity, emitters 14 and 15 are shown dotted in FIG. 2, when under the oxide.

Bases 12 and 13 of transistors TT and LT are widely separately electrically by an indentation 18 of base perimeter 16. This indentation 18 is filled with collector material. A narrow connecting channel 19, filled with base material, serves as a connection between base regions 12 and 13. Connecting channel 19 introduces a resistance $R_T$ between the two bases.

Figure 5:
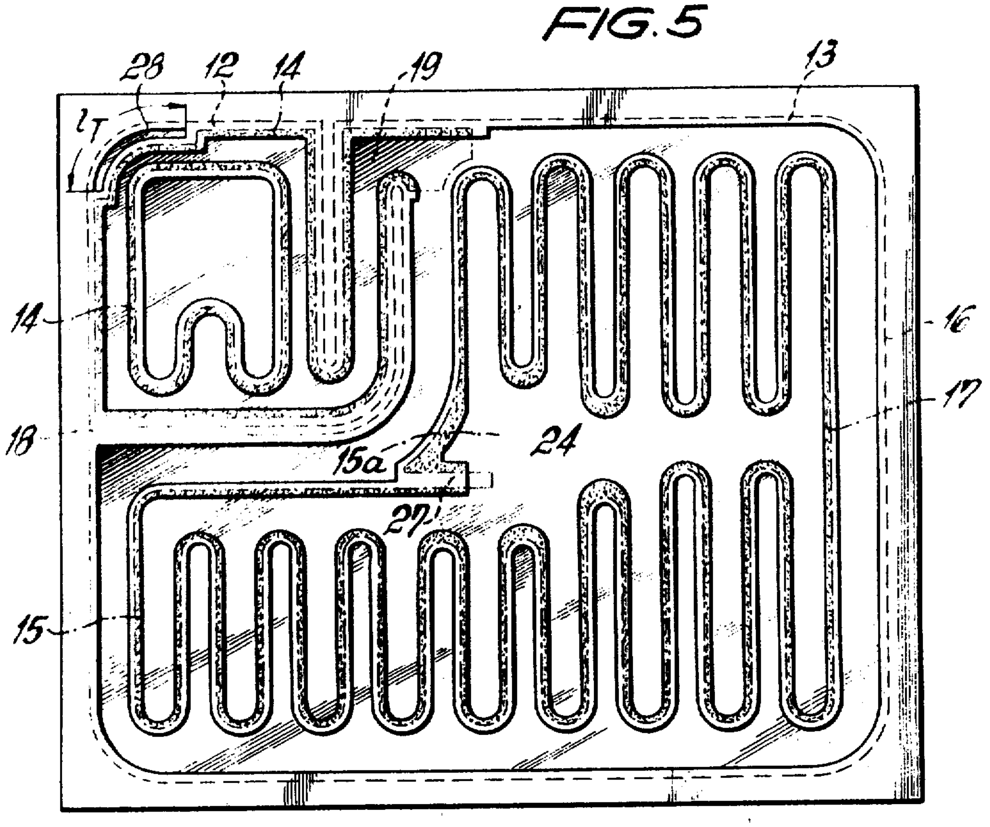
FIG. 5 shows a horizontal projection of a second embodiment of a monolithic Darlington transistor circuit in accordance with this invention.

Emitter 14 of transistor TT is diffused into base 12 of the first transistor. Preferably, this emitter is in substantially ring shape, that is, the emitter region has an inside and an outside perimeter, both of which are closed curves when viewed from the top, as shown in FIGS. 2 and 5. Further, emitter 14 extends over the connecting channel 19 into base 13, or the second base. There, it branches into one extension 14*a* in the direction of the connecting channel 19, and a second extension, 14*b*, perpendicular to connecting channel 19.

The second emitter, namely the emitter of the power transistor, denoted by 15, is diffused into the remaining part of base 13 of transistor LT. Emitter 15 consists of a central portion 15*a* having a relatively large surface which is used for the external emitter connection. Emitter 15 further comprises four emitter "teeth" 15*b*, 15*c*, 15*d*, and 15*e*. The midpoint of central portion 15*a* is situated approximately upon a diagonal extending from the midpoint of driving transistor emitter 14 to the diametrically opposite corner of semiconductor disc 10. The two pairs of emitter "teeth," namely 15*b*, 15*c* and 15*d*, 15*e* are placed substantially with mirror symmetry with respect to this diagonal. Thus, emitter "teeth" 15*b* and 15*c* extend from the central portion 15*a* to the extension 14*a* of driving transistor emitter 14, parallel to the extension 14*b*.

The lower surface of the semiconductor disc 10 is completely covered by a metallic coating 20 which is the collector metallization and serves to permit the soldering of the external collector connection K. The top surface of semiconductor disc 10 is covered, in part, with an oxide layer 21 for protecting the PN junctions. Only those parts of the top surface are metallized which are not covered with oxide. Base metallization, or metal coating 22, of the driving transistor TT serves for the soldering of the external base connection B. Furthermore emitter 14 of the driving transistor TT has an emitter metal coating 23*a*, while base 13 of power transistor LT has a base metal coating 23*b*. Emitter metal coating 24 is on the emitter 15 of power transistor LT in order to permit soldering of the external emitter connection E. The connecting wire for this external connection is soldered to that part of the metal coating which is on top of the central portion 15*a* of the power transistor emitter.

A metal coating 23*c* forms the electrical connection between emitter 14 of the driving transistor TT and base 13 of power transistor LT. This metal coating is situated directly on the upper surface of the semiconductor body. It extends over the connecting channel 19 and over the extended driving transistor emitter 14 including its extensions 14*a* and 14*b*. Thus the metal coatings 23*a*, 23*b* and 23*c* form jointly a single continuous metal coating or metallization 23.

Since the metallization or metal coating 23 is separated by a PN junction from the connecting channel 19, it cannot short circuit the resistance $R_T$ formed by this connecting channel. Only directly opposite emitter "teeth" 15*b* and 15*c* of power transistor LT, does the metallization 23 cross the PN junction between driving transistor emitter 14 and power transistor base 13, thus serving as a base connection to the power transistor.

Resistance $R_T$ parallel to the emitter-base junction of driving transistor TT is constituted by the base material between the collector-base junction and the emitter-base junction, approximately between points 25 and 26. It can be shown that this resistance has the magnitude given by the following equation:

$$R \approx \sqrt{\frac{\varphi o}{t}\,\frac{\varphi B}{W}\,\frac{a}{b}}\cdot Tgh\sqrt{\frac{\varphi o}{\varphi B}\,\frac{W}{t}\,\frac{L^2}{ab}}+\frac{c}{2tb}\cdot\varphi_0 \quad (1)$$

wherein:

$t$ = depth of the base-collector junction;

$\rho_0$ = the average specific resistance of the base material from the top surface of semiconductor disc 10 to a depth $t$ of the base-collector junction;

$\rho_B$ = the average specific resistance of the base material between the emitter-base junction and the base-collector junction;

$W$ = the distance between the emitter-base junction and the base-collector junction (= width of the base);

= distance between emitter-base junction and base-collector junction at the top surface of the semiconductor body;

$a$ = width of extension 14*a* of driving transistor emitter 14;

$c$ = length of connecting channel 19 between driving transistor base 12 and power transistor base 13;

$L$ = length of the driving transistor emitter diffusion underneath the base metal coating or metallization 23*b* (= length of the extension 14*a*).

$Tgh$ = hyperbolic tangent.

Thus enough independent parameters, for example, *a*, *b*, *c* exist, to allow the resistance $R_T$ to have a desired value. If a particularly high resistance value of $R_T$ is desired, the emitter 14 may be increased in size at both sides of the connecting channel 19, by rounding off the angles included between the sides of the emitter at the respective location (an increase in dimension *a* at points 25 and 26, FIG. 2).

Furthermore, a resistance $R_L$ is provided parallel to the emitter-base junction of the second transistor, or power transistor LT. This resistance is formed by an indentation 27 of the second emitter 15 and by a short circuiting of the emitter base junction of the second transistor by the emitter metal coating 24 at the inside of this indentation. In this manner a protective diode D parallel to the emitter-collector junction of the second or power transistor is automatically created. The indentation 27 constitutes a base subregion. The portions of the emitter 15, that is, the portions of the emitter tooth 15*d* which enclose in part the base subregion or indentation 27 may be considered second emitter extensions.

It is a further object of this invention to make the monolithic Darlington transistor circuit as insensitive to voltage surges as possible. In order to accomplish this, it is desirable to distribute the energy associated with such voltage surges to the maximum possible crystal surface, in order to keep the energy density as small as possible.

For a Darlington transistor circuit with two ideal transistors, that is without resistances $R_T$ and $R_L$ (FIG. 1), the breakthrough would occur over the total emitter surface. That is, it would occur over the total emitter surface if it is assumed that the transistors are uniform over said surface.

By means of resistances $R_T$ and $R_L$, schematically illustrated in FIG. 1 and embodied in FIG. 2, a uniform connection to the emitter perimeter may be achieved even when this large surface is not completely homogeneous. For this purpose the base surfaces $F_{TT}$ and $F_{LT}$ covered by the emitter regions 14 and 15 of transistors TT and LT must have values related to the values of resistances $R_T$ and $R_L$ by the following inequality:

$$\frac{R_T}{R_L} > \frac{F_{TT}+F_{LT}}{F_{LT}} \quad (2)$$

This equation may be derived under assumption of proportionality between blocking current and surface area.

It is not difficult to satisfy the above inequality, since the resistance values of $R_T$ and $R_L$ are freely selectable within wide limits. Thus, starting with the desired overall amplification of the Darlington transistor circuit, the individual amplification factors for the driving transistor and the power transistor are determined. These in turn determine the required emitter perimeters of the two transistors. In conjunction with requirements dictated by the manufacturing process, the required surfaces of the transistors may then be determined, and, from these so-determined surfaces, the desired resistance ratio $R_T/R_L$ is determined in compliance with the above equation 2.

FIG. 5 shows a top view of a second preferred embodiment of a monolithic Darlington transistor circuit in accordance with this invention. Here, the connecting channel 19 between the bases 12 and 13 is formed by base material filling the space in the collector material left by two indentations 18 and 18*a* in the base perimeter 16. This results in a substantial lengthening of this connecting channel relative to the first embodiment which had only a single indentation 18. This in turn causes an increase in the resistance $R_T$ relative to the same resistance in the first embodiment.

In order to prevent a localized breakthrough of driving transistor TT upon energization, the emitter 14 of driving transistor TT is decreased in width at that corner which is diametrically opposite to the corner, also called the first corner, at which the connecting channel 19 enters the driving transistor base 12. As shown in FIG. 5, this decrease in width extends over a length $l_T$. The space thus saved is used for an additional metallization 28 of driving transistor base 12. The additional metallization 28 ensures a uniform energization over length $l_T$ over the outer perimeter of emitter 14.

In accordance with this invention, the distance $l_T$ should be at least as great as the perimeter of transistor LT divided by its amplification. Then the stress per unit length for the PN junction at this corner is as great as that in the power transistor, thus ensuring a uniform energy distribution.

A further difference between the embodiment shown in FIG. 5 and that shown in FIG. 2 is that the resistance $R_L$ makes contact with the emitter 15 of the power transistor at the central portion 15a. This yields a protection against the "pinch-in" effect.

While the invention has been illustrated and described as embodied in a monolithic circuit having particular emitter and base configurations, it is not intended to be limited to the details shown, since various modification and structural and configurational changes may be made without departing in any way from the spirit of the present invention.

What we claim as new and desire to be protected by Letters Patent is set forth in the appended claims.

1. Monolithic transistor circuit including a first transistor having a first base, first emitter, and first collector and a second transistor having a second base, second emitter, and second collector, manufactured in planar technique, and comprising, in combination, a semiconductor body of collector material, said semiconductor body having a first and second surface; a first and second base region diffused into said semiconductor body, constituting, respectively, a first and second base; said first and second emitter region diffused into said base regions and constituting, respectively, said first and second emitter, external collector-connecting means, directly connected electrically to said collector material; external emitter-connecting means electrically directly connected to said second emitter region; external base-connecting means directly connected to said first base region; a connecting channel of base material connecting said first base region to said second base region; and a metallic coating situated upon said first surface of said semiconductor body, extending over said connecting channel, and connecting said first emitter region to said second base region over a predetermined part of the base-emitter junction of said region, said predetermined part excluding said connecting channel.

2. A transistor circuit as set forth in claim 1, wherein said first emitter region has a first emitter extension situated directly underneath said metallic coating, and extending for the length thereof.

3. A transistor circuit as set forth in claim 2, wherein said first emitter extension further extends into said second base region.

4. A transistor circuit as set forth in claim 3, wherein said first emitter region is of substantially ring shape.

5. A transistor circuit as set forth in claim 5, wherein said transistor circuit further comprises resistance means constituting a resistance in parallel to the emitter-base junction of said second transistor; wherein said transistor circuit further comprises protective diode means electrically in parallel to the emitter-collector junction of said second transistor.

6. A transistor circuit as set forth in claim 5, wherein said second emitter region comprises a first and second emitter extension at least partially enclosing a base subregion, the boundary between said second emitter extensions and said base subregion constituting a base-emitter junction; further comprising second emitter metallic coating means short circuiting a portion of said base-emitter junction, whereby, effectively, said protective diode means and said resistance in parallel to said emitter-base junction of said second transistor are created.

7. A transistor circuit as set forth in claim 6, wherein said resistance in parallel to the base-emitter junction of said second transistor is $R_L$; wherein said connecting channel of base material constitutes a second resistance $R_T$; wherein the base surface of said first transistor covered by said first and second emitters is denoted by $F_{TT}$; wherein the base surface of said second transistor covered by said first and second emitters is denoted by $F_{LT}$; and wherein:

$$\frac{R_T}{R_L} > \frac{F_{TT}+F_{LT}}{F_{LT}}$$

8. A transistor circuit as set forth in claim 7, wherein said second emitter comprises a central portion; wherein said first and second emitter extension extend directly from said central portion; and where the contact point of said resistance $R_L$ is situated at said central portion.

9. A transistor circuit as set forth in claim 8, wherein said first emitter region is of substantially rectangular shape, said rectangular shape having an internal and an external perimeter; wherein said connecting channel enters the first base region substantially at a first corner of said rectangular shape; wherein the distance between said external and said internal perimeter of said rectangular shape is decreased at the corner of said rectangular shape diametrically opposite to said first corner, thus creating additional base region; and wherein additional metallic coating is applied to said additional base region.

10. A transistor circuit as set forth in claim 9, wherein the length of said additional metallic coating along said outside perimeter is at least as great as said outside perimeter divided by the amplification of said second transistor.